(12) United States Patent
Akizuki et al.

(10) Patent No.: US 7,265,167 B2
(45) Date of Patent: Sep. 4, 2007

(54) EPOXY RESIN COMPOSITION FOR SEMICONDUCTOR ENCAPSULATION, AND SEMICONDUCTOR DEVICE USING THE SAME

(75) Inventors: Shinya Akizuki, Ibaraki (JP); Kazuhiro Ikemura, Ibaraki (JP); Hisataka Ito, Ibaraki (JP); Takahiro Uchida, Ibaraki (JP); Takuya Eto, Ibaraki (JP); Tsutomu Nishioka, Ibaraki (JP); Katsumi Shimada, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 414 days.

(21) Appl. No.: 10/703,494

(22) Filed: Nov. 10, 2003

(65) Prior Publication Data

US 2004/0097632 A1  May 20, 2004

(30) Foreign Application Priority Data

Nov. 12, 2002 (JP) .................... P. 2002-328726
Nov. 22, 2002 (JP) .................... P. 2002-339797
Nov. 22, 2002 (JP) .................... P. 2002-339798

(51) Int. Cl.
C08K 3/36 (2006.01)
C08L 63/00 (2006.01)
C08L 63/02 (2006.01)
H01L 23/29 (2006.01)

(52) U.S. Cl. ............... 523/466; 257/789; 257/793; 525/481; 525/507

(58) Field of Classification Search ............ None
See application file for complete search history.

(56) References Cited

U.S. PATENT DOCUMENTS 4,615,741 A * 10/1986 Kobayashi et al. ......... 524/493
5,028,407 A * 7/1991 Chieng et al. .............. 423/338
5,096,762 A * 3/1992 Yoshida et al. ............... 428/76
6,129,899 A * 10/2000 Katsuro et al. ............. 423/338
6,248,454 B1 * 6/2001 Ikemura .................... 428/620

FOREIGN PATENT DOCUMENTS

| CN | 1065659 C | 5/2001 |
|---|---|---|
| EP | 0 292 174 A | 11/1988 |
| EP | 1 004 630 A1 | 5/2000 |
| EP | 1004630 A1 * | 5/2000 |
| JP | 58-138740 A * | 8/1983 |
| JP | 59-179539 A | 10/1984 |
| JP | 60-115641 A | 6/1985 |
| JP | 61-040811 A | 2/1986 |
| JP | 01-096008 A | 4/1989 |
| JP | 02-145415 A | 6/1990 |
| JP | 02-158637 A | 6/1990 |
| JP | 02-226615 A | 9/1990 |
| JP | 5-330817 A * | 12/1993 |
| JP | 11-199757 A | 7/1999 |
| JP | 11-199757 A * | 7/1999 |
| JP | 343392 A | 12/1999 |
| JP | 2000-007350 A | 1/2000 |
| JP | 2001-192499 A | 7/2001 |
| JP | 2001-354838 A | 12/2001 |
| JP | 2004-168990 A | 6/2004 |

OTHER PUBLICATIONS

Abstracts for Japanese Patent No. 59-179539, Denki Kagaku Kogyo KK, Mar. 29, 1983.*
Abstracts for Japanese Patent No. 60-115641, Denki Kagaku Kogyo KK, Jun. 22, 1985.*

* cited by examiner

*Primary Examiner*—Robert Sellers
(74) *Attorney, Agent, or Firm*—Sughrue Mion, PLLC (57) ABSTRACT

An epoxy resin composition for semiconductor encapsulation capable of giving semiconductor devices of high reliability that do not cause short circuits even in pitch reduction in the interconnection electrode distance or the conductor wire distance therein as well as a semiconductor device using the same. The epoxy resin composition for semiconductor encapsulation, which comprises the following components (A) to (C): (A) an epoxy resin, (B) a phenolic resin, and (C) an inorganic filler for preventing semiconductors from short-circuiting in a step of semiconductor encapsulation.

7 Claims, 3 Drawing Sheets

EPOXY RESIN COMPOSITION FOR SEMICONDUCTOR ENCAPSULATION, AND SEMICONDUCTOR DEVICE USING THE SAME

FIELD OF THE INVENTION

The present invention relates to an epoxy resin composition for semiconductor encapsulation capable of giving semiconductor devices of high reliability that do not cause short circuits even in pitch reduction in the interconnection electrode distance or the conductor wire distance therein, and relates to the semiconductor device with it.

BACKGROUND OF THE INVENTION

Semiconductor chips such as transistors, IC and LSI are generally resin-encapsulated through transfer molding with an epoxy resin composition. Various package forms of the type have heretofore been developed in the art.

Figure 1:
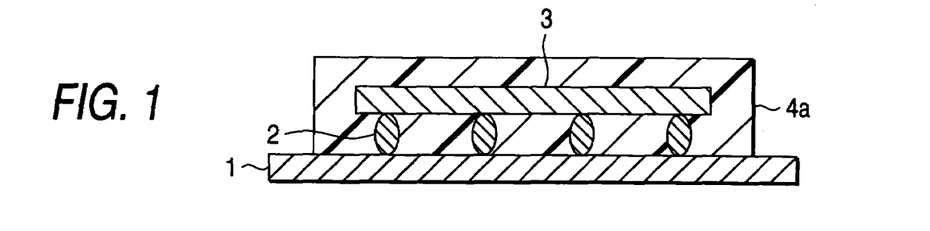
FIG. 1 is a cross-sectional view showing one package form of a semiconductor device.

One example of the package form is a type as in FIG. 1. In this, 1 is an insulating substrate, and a semiconductor chip 3 is mounted on the insulating substrate 1 via an interconnection electrode 2 so that the insulating substrate 1 and the semiconductor chip 3 are electrically connected to each other. This is encapsulated in an encapsulation resin 4a, a cured product of an epoxy resin composition that serves as an encapsulation material, on the side of the insulating substrate 1 having the semiconductor chip 3 mounted thereon. Apart from this type, also mentioned is another package as in FIG. 2. In this package, a semiconductor chip 3 is mounted on an insulating substrate 5, and the insulating substrate 5 and the semiconductor chip 3 are electrically connected to each other via a wire 6. Including the wire 6, the semiconductor chip 3 is resin-encapsulated in an encapsulation resin 4b, a cured product of an epoxy resin composition. Further mentioned is still another package as in FIG. 3. In this package, a semiconductor chip 3 is mounted on a lead frame 7 of metal, and the semiconductor chip 3 is electrically connected to an inner lead 8 via a wire 6. Including the wire 6, the semiconductor chip 3 is resin-encapsulated in an encapsulation resin 4c, a cured product of an epoxy resin composition. Apart from the package types mentioned above, still another package is mentioned as in FIG. 4. In this, a semiconductor chip 3 is mounted on a lead frame 10 of metal, and the semiconductor chip 3 is electrically connected to an inner lead 11 provided around the lead frame 10, via a wire 6. Including the wire 6, the semiconductor chip 3 is resin-encapsulated in an encapsulation resin 4d, a cured product of an epoxy resin composition.

SUMMARY OF THE INVENTION

The capabilities of the semiconductor devices of these types are improving these days, and it is desired to reduce the pitch distance between the interconnection electrodes 2 or the wires 6 in the semiconductor devices. However, the pitch reduction results in frequent occurrence of short circuits in the process of semiconductor encapsulation. In that situation, various investigations are made, for example, for reducing the carbon deposition in semiconductor encapsulation, but could not lead to a drastic solution of the problem. It is now desired to prevent the occurrence of short circuits in producing semiconductor devices, and to produce good semiconductor devices of high reliability.

The invention has been made in consideration of the situation as above, and its object is to provide an epoxy resin composition for semiconductor encapsulation capable of giving semiconductor devices of high reliability that do not cause short circuits even in pitch reduction in the interconnection electrode distance or the conductor wire distance therein, and to provide the semiconductor device with it.

Specifically, the invention provides the following:

(1) An epoxy resin composition for semiconductor encapsulation, which comprises the following components (A) to (C):
 (A) an epoxy resin,
 (B) a phenolic resin,
 (C) an inorganic filler capable of preventing semiconductors from short-circuiting in a step of semiconductor encapsulation with the epoxy resin composition.

(2) The epoxy resin composition for semiconductor encapsulation of above (1), wherein the inorganic filler (C) contains at most 2.5 ppm of carbon-coated inorganic filler particles (c) having a particle size larger than the interconnection electrode or conductor wire distance in a semiconductor device which is to be encapsulated by the use of the composition and comprises a semiconductor chip mounted on an insulating substrate or a lead frame and in which the semiconductor chip is electrically interconnected to the insulating substrate or the lead frame via an interconnection electrode or a conductor wire.

(3) The epoxy resin composition for semiconductor encapsulation of above (1), wherein the inorganic filler (C) contains at least 50% by weight of spherical fused silica particles (c') for which the heat source in fusion is the combustion heat of a heat source material not causing carbon deposition on the surfaces of the spherical fused silica particles and oxygen gas.

(4) The epoxy resin composition for semiconductor encapsulation of above (3), wherein the spherical fused silica particles (c') are produced from a siliceous material which is fed into a furnace through a double-walled burner that comprises concentric inner and outer tubes and multiple small tubes provided between the inner and outer tubes, in such a manner that the siliceous material is via the inner tube, the heat source material for fusion not causing carbon deposition on the surfaces of the spherical fused silica particles is via the small tubes, and oxygen gas is via the space between the small tubes and the outer tube, and which is fused by the gas combustion in the furnace.

(5) The epoxy resin composition for semiconductor encapsulation of above (3), wherein the heat source material for fusion not causing carbon deposition on the surfaces of the spherical fused silica particles is hydrogen gas.

(6) The epoxy resin composition for semiconductor encapsulation of above (3), wherein the heat source material for fusion not causing carbon deposition on the surfaces of the spherical fused silica particles is a mixture of oxygen gas and combustible hydrocarbon gas.

(7) A semiconductor device with a semiconductor chip encapsulated in the epoxy resin composition of above (1)

(8) The semiconductor device of above (7), wherein the semiconductor chip mounted on an insulating substrate or a lead frame is electrically interconnected to the insulating substrate or the lead frame via an interconnection electrode or a conductor wire and is encapsulated in a layer of the epoxy resin composition.

The present inventors have extensively investigated to find out the substance that may cause short circuits in semiconductor encapsulation. As a result, we have found that the cause for short circuits in semiconductor encapsulation is not in carbon black that is generally in the material for encapsulation but is in an inorganic filler. One example of the inorganic filler heretofore used in the art is fused silica powder. We have analyzed a sample of fused silica powder in detail, and have found that a part of the fused silica particles are coated with a deposit of carbon. We have further found that the carbon-coated fused silica particles in the inorganic filler used for semiconductor encapsulation stay between the interconnection electrodes or between the conductor wires in the encapsulated semiconductor devices to thereby electrically interconnect the electrodes or the wires to cause short circuits therein.

Based on these findings, we have specifically noted the production of carbon-coated fused silica particles as above, and have made many studies essentially for the production of carbon-uncoated fused silica particles. Heretofore, the combustion heat from a mixture of combustible gases, propane gas and oxygen gas is used for the heat source in producing fused silica particles. Concretely, the mixed gas and a siliceous material are jetted into a furnace to produce fused silica particles, and, in this connection, we have found out the following: In this process, carbon that is derived from the propane gas deposits around a burner, and this deposits on the surfaces of the fused silica particles to give carbon-coated fused silica particles.

Further based on the findings as above, we have made many other studies to find out the uppermost limit of the proportion of carbon-coated inorganic filler particles having a particle size larger than the interconnection electrode or conductor wire distance in semiconductor devices, relative to all the inorganic filler to be used, for preventing the occurrence of short circuits in semiconductor encapsulation. As a result, we have found that, when the proportion of the carbon-coated inorganic filler particles having a particle size larger than the interconnection electrode or conductor wire distance in semiconductor devices is limited to at most 2.5 ppm of all the inorganic filler used for semiconductor encapsulation, then it makes it possible to prevent short circuits in the process of resin encapsulation for producing semiconductor devices.

The present inventors have further found that, when (1) hydrogen gas or (2) a mixture of combustible hydrocarbon gas such as typically propane gas and oxygen gas is used for the heat source for fusion in place of conventional propane gas to produce fused silica particles, then it makes it possible to produce fused silica particles with no carbon deposition around a burner. We have still found that, when an inorganic filler which contains at least 50% by weight of the thus-produced, carbon-uncoated fused silica particles is used in semiconductor encapsulation, then it makes it possible to prevent short circuits in the process of semiconductor encapsulation. On the basis of the findings as above, we have completed the present invention.

BRIEF DESCRIPTION OF THE DRAWINGS

By way of example and to make the description more clear, reference is made to the accompanying drawing in which.

DESCRIPTION OF REFERENCE NUMERALS 1, 5: Insulating Substrate
2: Interconnection Electrode
3: Semiconductor Chip
4a, 4b, 4c, 4d: Resin for Encapsulation
6: Wire
7, 10: Lead Frame

DETAILED DESCRIPTION OF THE INVENTION

The present invention are further described in detail herein under.

The epoxy resin composition for semiconductor encapsulation of the invention comprises an epoxy resin (component A), a phenolic resin (component B) and a specific inorganic filler (component C), and it is generally in the form of powder or tablets produced by tabletting it.

The epoxy resin (component A) for use in the invention is not specifically limited and may be any ordinary epoxy resin. For example, it includes cresol-novolak type, phenol-novolak type, bisphenol-A type, biphenyl type, triphenyl-methane type, naphthalene type and other various types of epoxy resins. One or more of these may be used either singly or as combined.

The phenolic resin (component B) that is used herein along with the above epoxy resin (component A) serves as a curing agent for the epoxy resin. Also not specifically limited, it may be any known ordinary phenolic resin. For example, it includes phenol-novolak, cresol-novolak, bisphenol-A type novolak, naphthol-novolak, phenol-aralkyl resins, etc. One or more of these may be used either singly or as combined.

Preferably, the epoxy resin (component A) and the phenolic resin (component B) are proportioned in such a manner that the hydroxyl equivalent of the curing agent may be from 0.5 to 2.0 equivalents, more preferably from 0.8 to 1.2 equivalents relative to one epoxy equivalent of the epoxy resin.

The specific inorganic filler (component C) that is used along with the above components A and B in the invention is characterized in that it acts to prevent the occurrence of short circuits of semiconductor chips in the process of semiconductor encapsulation. The prevention of the occurrence of short circuits in semiconductor encapsulation may be attained, for example, by limiting the amount of carbon-coated inorganic filler particles having a particle size larger than the interconnection electrode or conductor wire distance in semiconductor devices, to at most a specifically-defined one, and/or by making the amount of carbon-uncoated inorganic filler particles not smaller than a specifically-defined one.

Described below is the case of limiting the amount of carbon-coated inorganic filler particles having a particle size larger than the interconnection electrode or conductor wire distance in semiconductor devices, to at most a specifically-defined one.

The specific inorganic filler (component C) that is used along with the components A and B contains at most 2.5 ppm of carbon-coated inorganic filler particles (c) having a particle size larger than the interconnection electrode or conductor wire distance in semiconductor devices such as those mentioned hereinabove.

If the content of the carbon-coated inorganic filler particles (c) having a particle size larger than the interconnection electrode or conductor wire distance in semiconductor devices is larger than 2.5 ppm of all the inorganic filler (C), then the particles (c) stay between the interconnection electrodes or between the conductor wires in semiconductor devices to thereby electrically interconnect the electrodes or the wires to cause short circuits therein. Preferably, the content of the particles (c) is as small as possible, but is generally not smaller than 0.02 ppm. The content of the carbon-coated inorganic filler particles (c) in the inorganic filler (C) may be determined and computed, for example, as follows: A predetermined sample of inorganic filler to be analyzed is put into a rectangular case having a size of 5 cm×4.8 cm. Its face is just flattened and is observed with an optical microscope to count the number (A) of black points (carbon-coated inorganic filler particles) having a predetermined particle size. The total number (B) of all the inorganic filler particles that exist on the face of the rectangular case having a size of 5 cm×4.8 cm is computed, based on the mean particle size (C) of the inorganic filler particles according to the following formula (1). The proportion (D) of the black points having the predetermined particle size to all the inorganic filler particles is computed according to the following formula (2).

$$B(\text{number}) = (5 \times 4.8 \times 10^6)/C^2 \quad (1)$$

$$D(\text{ppm}) = (A/B) \times 10^6 \quad (2)$$

The interconnection electrode distance or conductor wire distance in semiconductor devices may be from 10 to 100 μm.

Preferably, the mean particle size of the inorganic filler is from 2 to 40 μm, more preferably from 5 to 30 μm. The mean particle size may be determined by the use of a laser scattering particle size analyzer.

The blend ratio of the specific inorganic filler (component C) is preferably at least 75% by weight, more preferably from 80 to 91% by weight of all the epoxy resin composition. If it is smaller than 75% by weight, then the reliability of semiconductor devices may be poor in point of the soldering resistance thereof.

Not specifically defined, the inorganic filler may be any known one and includes, for example, quartz glass powder, silica powder, alumina, talc, etc. Especially preferred are spherical fused silica particles.

Next described is the case of making the amount of carbon-uncoated inorganic filler particles not smaller than a specifically-defined one.

The specific inorganic filler (component C) that is used along with the components A and B contains at least 50% by weight of spherical fused silica particles (c') that are produced according to a specific process. More preferably, the content of the spherical fused silica particles (c') is 100% by weight of the component (C). The heat source for fusion in producing the spherical fused silica particles (c') is the combustion heat of a heat source material not causing carbon deposition on the surfaces of the spherical fused silica particles and oxygen gas.

If the content of the spherical fused silica particles (c') is smaller than 50% by weight of all the inorganic filler (C), or for example, if conventional fused silica particles are used for the inorganic filler (C), then the inorganic filler (C) may contain many carbon-coated fused silica particles and the carbon-coated fused silica particles stay between the interconnection electrodes or between the conductor wires in semiconductor devices to thereby electrically interconnect the electrodes or the wires to cause short circuits therein.

Examples of the heat source for fusion not causing carbon deposition on the surfaces of the spherical fused silica particles produced are (1) hydrogen gas alone, and (2) a mixture of oxygen gas and combustible hydrocarbon gas.

In the mixture of oxygen gas and combustible hydrocarbon gas, the combustible hydrocarbon gas is not specifically defined and may be any conventional one such as propane gas. The blend ratio in the mixed gas may be so defined that it does not overstep the flammability limit of the mixture. Preferably, the ratio by volume of oxygen gas/combustible hydrocarbon gas falls between 1/0.9 and 1/1.1, more preferably it is 1/1.

Next described in detail is the method for producing the spherical fused silica particles (c'). For example, a siliceous material is fed into a vertical furnace along with gas flames of a mixed gas of a heat source material for fusion not causing carbon deposition on the surfaces of the spherical fused silica particles produced and oxygen gas thereinto, and this is dispersed in the flames and then fused, while it keeps its individual particles, into spherical fused silica particles.

The siliceous material is not specifically defined, and may be any one generally used in producing spherical fused silica particles. For example, it may be prepared by grinding silica stones that have a composition of 99.5% $SiO_2$, 1% $Al_2O_3$, 0.05% $Fe_2O_3$, 0.005% $Na_2O$ and 0.003% $K_2O$, into ground particles having a particle size of at most 500 μm, preferably at most 200 μm. If the particle size thereof is larger than the defined range as above, then the silica particles could not be well fused into spherical particles or could not be completely fused.

The ground silica particles are jetted into a vertical furnace along with a mixture of hydrogen gas and oxygen gas thereinto, and dispersed in the burning flames at 2000° C. or higher and fused into spherical fused particles.

The facilities and the structures of the vertical furnace and the inner burner thereof may be any known ones. Precisely, it is desirable that the furnace is a vertical furnace in which the starting siliceous material fed thereinto may be uniformly dispersed in burning flames and may be fused therein. For example, mentioned is a vertical furnace as in FIG. 5. A hopper 21 for storing a siliceous material therein is provided at the top of the vertical furnace. From the hopper 21, a material feed duct 22 extends and it is connected to the furnace body 26. As in FIG. 6A and FIG. 6B, multiple small tubes 23 for hydrogen gas introduction are disposed around the material feed duct 22, an outer tube 25 is disposed to surround the small tubes 23, and these constitute a burner of the furnace. Specifically, the burner through which a siliceous material is jetted into a furnace along with gas flames of a mixed gas of a heat source material for fusion not causing carbon deposition on the surfaces of the spherical fused silica particles produced and oxygen gas thereinto has a double-walled structure that comprises the outer tube 25 and the material feed duct (inner tube) 22. The heat source material for fusion not causing carbon deposition on the surfaces of the spherical fused silica particles produced, and the oxygen gas must be introduced into the furnace at different flow rates. Accordingly, a number of small tubes 23 are disposed in the space between the outer tube 25 and the material fee duct (inner tube) 22, and the small tubes 23 serves as feed ducts for the heat source material for fusion not causing carbon deposition on the surfaces of the spherical fused silica particles produced. The space around the small tubes 23 (the space between the small tubes 23 and the outer tube 25) serves as an oxygen gas feed duct 24, and the heat source material for fusion not causing carbon deposition on the surfaces of the spherical fused silica particles produced may be introduced into the furnace simultaneously with oxygen gas thereinto.

Figure 5:
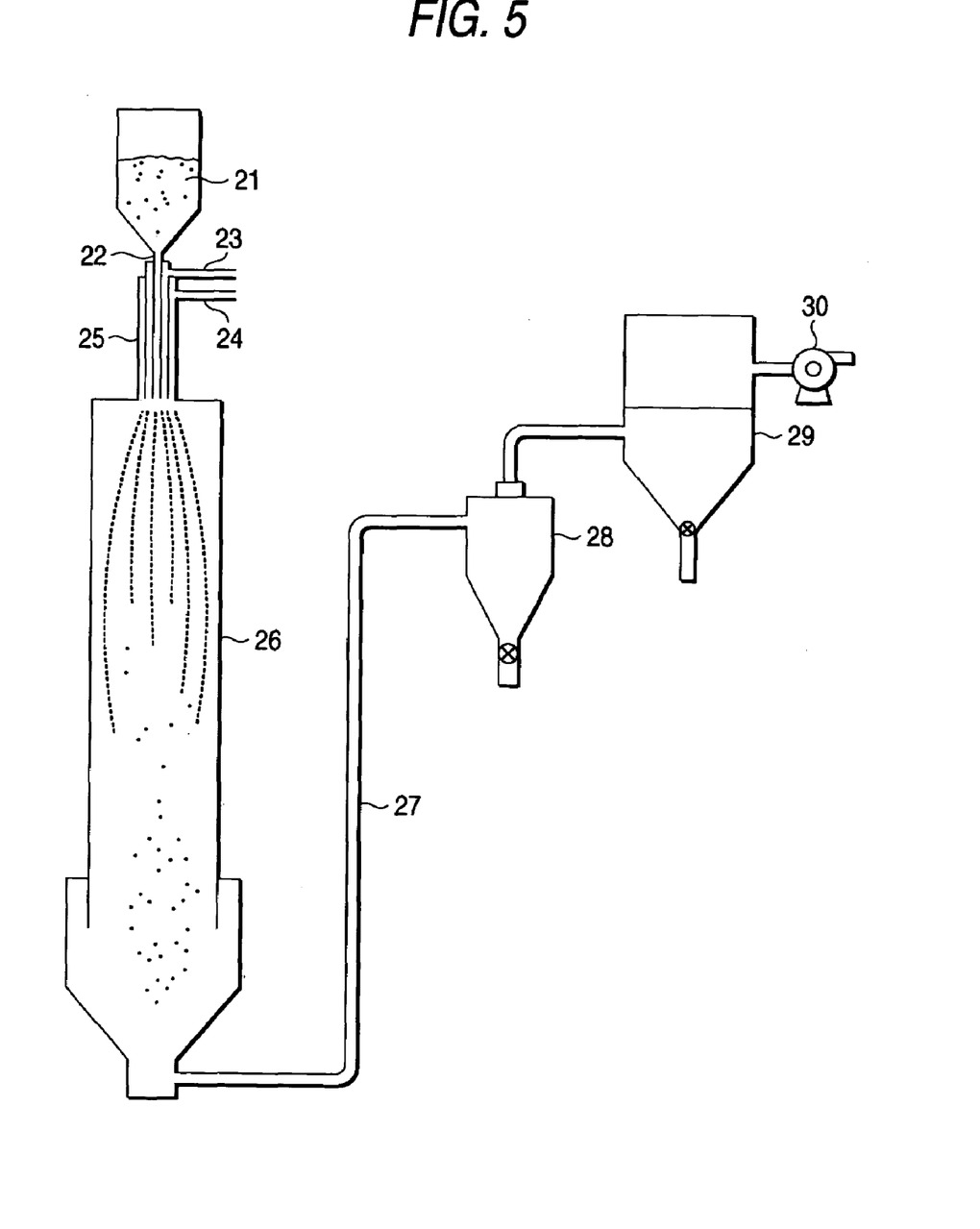
FIG. 5 is a cross-sectional view graphically showing the constitution of an apparatus for producing spherical fused silica particles.

A transfer tube 27 is fitted to the bottom of the furnace body 26, via which the spherical fused silica particles produced are transferred into a cyclone 28 and then into a bag filter 29 along with the exhaust gas thereinto by the action of a blower 30. In the bag filter 29, the spherical fused silica particles are separated from the exhaust gas and collected therein.

Though varying depending on the production condition and others, the diameter and the length of the furnace body 26 may be such that the height thereof is from 5 to 100 times, preferably from 10 to 50 times the diameter thereof.

The apparatus of the illustrated type may be used in producing the intended spherical fused silica particles. Concretely, a heat source material for fusion not causing carbon deposition on the surfaces of the spherical fused silica particles produced and oxygen gas are jetted into the furnace through the burner thereof, and a starting siliceous material, ground silica is jetted into the burning flames at 2000° C. or higher in the furnace. In this case, it is desirable that the ground silica is fully dispersed in the burning flames and the residence time thereof in the burning flames is as long as possible.

The flow rate of the oxygen gas to form the burning flames may be at least 1.5 m/sec at the outlet of the burner, and the flow rate of the other heat source material, for example, hydrogen gas may be from 1 to 20 times, preferably from 2 to 10 times, more preferably from 2 to 6 times the oxygen gas flow rate.

The amount of the siliceous material, ground silica to be fed into the furnace is not specifically defined, and may be suitably determined depending on the size of the burner and the furnace body 26. For example, it may be from 1 to 100 kg/hr, preferably from 5 to 30 kg/hr or so. Regarding the mode of feeding the siliceous material into the furnace body 26, the material may be made to flow down spontaneously or under pressure. Preferably, however, the material is made to flow down spontaneously.

The time for which the siliceous material is heated in the burning flames may be determined appropriately. In general, the heating time for smaller siliceous particles may be shortened more.

The mean particle size of the spherical fused silica particles (c) thus produced in the manner as above is preferably from 2 to 40 µm, more preferably from 5 to 30 µm.

Of the inorganic filler (component C), the other than the spherical fused silica particles (c') is preferably silica powder.

Not specifically defined, the inorganic filler (component C) that contains the specific amount of the specific spherical fused silica particles (c') may be any known silica powder. Especially preferably, it is spherical fused silica particles like the specific spherical fused silica particles (c').

The mean particle size of the inorganic filler (component C) except the specific spherical fused silica particles (c') is preferably from 2 to 40 µm, more preferably from 5 to 30 µm. The mean particle size of the spherical fused silica particles (c') and the inorganic filler (component C) may be determined by the use of a laser scattering particle size analyzer.

The blend ratio of the specific inorganic filler (component C) is preferably at least 75% by weight, more preferably from 80 to 91% by weight of all the epoxy resin composition. If it is smaller than 75% by weight, then the reliability of semiconductor devices may be poor in point of the soldering resistance thereof.

In addition to the above components (A) to (C), the epoxy resin composition of the invention may optionally contain any other additives of, for example, curing promoter, halogen-containing flame retardant such as brominated epoxy resin, flame retardation promoter such as antimony trioxide, pigment such as carbon black, silane coupling agent such as β-(3,4-epoxycyclohexyl)ethyltrimethoxysilane and γ-glycidoxypropyltrimethoxysilane, and mold release such as carnauba wax, if desired.

The curing promoter may be any of amine-type or phosphorus-containing compounds. The amine-type compounds include, for example, imidazoles such as 2-methylimidazole, and tertiary amines such as triethanolamine and diazabicycloundecene. The phosphorus-containing compounds include, for example, triphenyl phosphine and tetraphenyl phosphine. These may be used either singly or as combined. The blend ratio of the curing promoter is preferably from 0.1 to 1.0% by weight of all the epoxy resin composition. More preferably, it is from 0.15 to 0.35% by weight in consideration of the flowability of the epoxy resin composition.

The epoxy resin composition for semiconductor encapsulation of the invention may be produced, for example, as follows: The above components (A) to (C) and optional additives are blended, then melt-kneaded under heat in a kneading machine such as a mixing roll or the like, and cooled to room temperature. The resulting blend is ground in any known manner and optionally tabletted into tablets. The process that comprises these steps gives the intended epoxy resin composition of the invention. If desired, carbon black, a type of pigment may be previously mixed with a part of epoxy resin to prepare a premix. The premix may be melt-mixed with the other constituent components, and the resulting mixture may be processed in the same manner as above to produce the intended epoxy resin composition of the invention.

Not specifically defined, encapsulation of semiconductor chips by the use of the epoxy resin composition may be effected in any known molding method, for example, through ordinary transfer molding.

Figure 2:
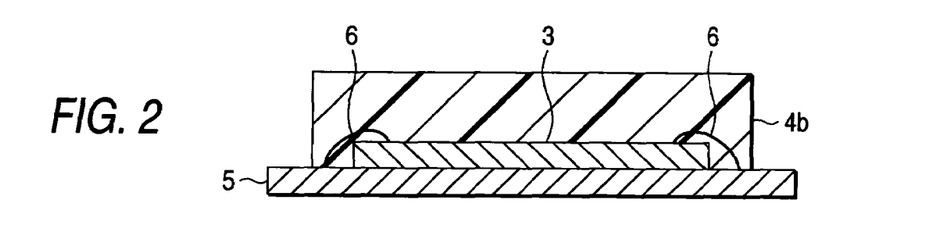
FIG. 2 is a cross-sectional view showing another package form of a semiconductor device.
Figure 3:
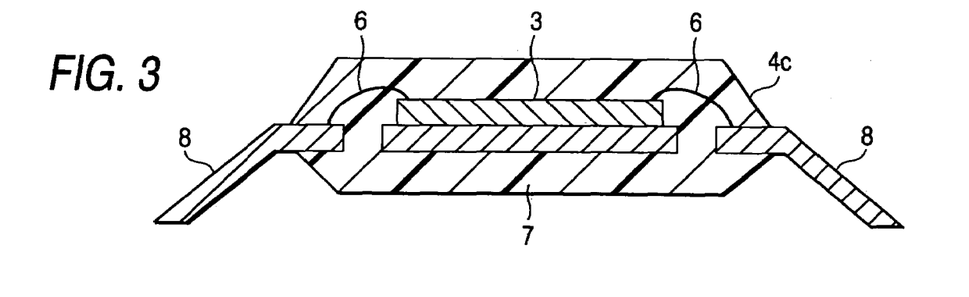
FIG. 3 is a cross-sectional view showing still another package form of a semiconductor device.

The semiconductor devices thus produced in the manner as herein are concretely the packages of FIG. 1 to FIG. 4 illustrated hereinabove. In the package of FIG. 1, a semiconductor chip 3 is mounted on an insulating substrate 1 via an interconnection electrode 2 so that the insulating substrate 1 and the semiconductor chip 3 are electrically connected to each other. This is encapsulated in an encapsulation resin 4a on the side of the insulating substrate 1 having the semiconductor chip 3 mounted thereon. In the package of FIG. 2, a semiconductor chip 3 is mounted on an insulating substrate 5, and the insulating substrate 5 and the semiconductor chip 3 are electrically connected to each other via a wire 6. Including the wire 6, the semiconductor chip 3 is resin-encapsulated in an encapsulation resin 4b. In the package of FIG. 3, a semiconductor chip 3 is mounted on a lead frame 7 of metal, and the semiconductor chip 3 is electrically connected to an inner lead 8 via a wire 6. Including the wire 6, the semiconductor chip 3 is resin-encapsulated in an encapsulation resin 4c. In the package of

Figure 4:
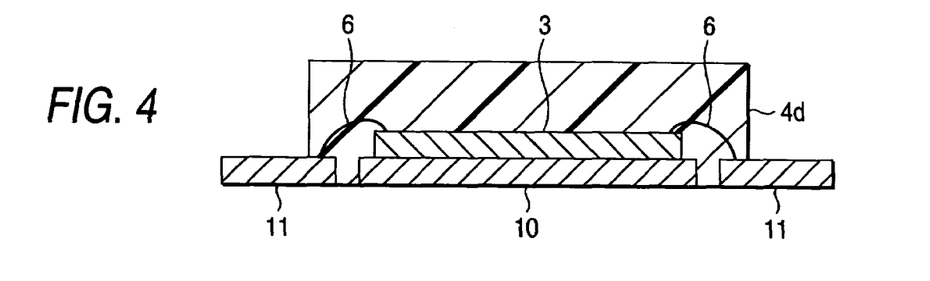
FIG. 4 is a cross-sectional view showing still another package form of a semiconductor device.

FIG. 4, a semiconductor chip 3 is mounted on a lead frame 10 of metal, and the semiconductor chip 3 is electrically connected to an inner lead 11 provided around the lead frame 10, via a wire 6. Including the wire 6, the semiconductor chip 3 is resin-encapsulated in an encapsulation resin 4d.

In the invention, the interconnection electrode is to electrically connect the insulating substrate 1 to the semiconductor chip 3, for example, as in FIG. 1. It may be any well-known electrode alone, but its concept is to include an electrode and a conductor such as a joint ball to be disposed around the electrode. The concept of the conductor wire in the invention is to include the wire 6 that electrically connects the semiconductor chip 3 to the insulating substrate, or the semiconductor chip 3 to the inner lead 8, or the semiconductor chip 3 to the inner lead 11, as well as the inner leads 8, 11 and the other wires on the insulating substrate 5, as in FIG. 2 to FIG. 4.

The invention is describe in more detail with reference to the following Examples and Comparative Examples.

The following components were prepared.

Epoxy Resin (a):
A biphenyl-type epoxy resin of the following formula (a) (having an epoxy equivalent of 173 and a melting point of 100° C.)

(a)

Epoxy Resin (b):
An epoxy resin having repetitive units of the following formula (b) (having an epoxy equivalent of 170 and a melting point of 60° C.).

(b)

Phenolic Resin:
A phenol-novolak resin (having a hydroxyl equivalent of 107 and a melting point of 60° C.).

Curing Promoter:
Triphenyl phosphine.

Flame Retardant:
Brominated epoxy resin.

Flame Retardation Promoter:
Antimony trioxide.

Mold Release:
Carnauba wax.

Pigment:
Carbon black.

Inorganic Filler (1-a):
Spherical fused silica powder (having a mean particle size of 20 μm) that contains carbon-coated fused silica particles (a1) to (a3) mentioned below.

| | |
|---|---|
| (a1): carbon-coated fused silica particles having a particle size of larger than 60 μm | 10 ppm |
| (a2): carbon-coated fused silica particles having a particle size of larger than 30 μm | 20 ppm |
| (a3): carbon-coated fused silica particles having a particle size of larger than 20 μm | 40 ppm |

Inorganic Filler (1-b):
Spherical fused silica powder (having a mean particle size of 10 μm) that contains carbon-coated fused silica particles (b1) to (b3) mentioned below.

| | |
|---|---|
| (b1): carbon-coated fused silica particles having a particle size of larger than 60 μm | 0 ppm |
| (b2): carbon-coated fused silica particles having a particle size of larger than 30 μm | 5 ppm |
| (b3): carbon-coated fused silica particles having a particle size of larger than 20 μm | 10 ppm |

Inorganic Filler (1-c):
Spherical fused silica powder (having a mean particle size of 2 μm) with carbon-coated fused silica particles (c1) to (c3) mentioned below.

| | |
|---|---|
| (c1): carbon-coated fused silica particles having a particle size of larger than 60 μm | 0 ppm |
| (c2): carbon-coated fused silica particles having a particle size of larger than 30 μm | 0 ppm |
| (c3): carbon-coated fused silica particles having a particle size of larger than 20 μm | 0 ppm |

Inorganic Filler (1-d):
Spherical fused silica powder (having a mean particle size of 15 μm) that contains carbon-coated fused silica particles (d1) to (d3) mentioned below.

| | |
|---|---|
| (d1): carbon-coated fused silica particles having a particle size of larger than 60 μm | 0 ppm |
| (d2): carbon-coated fused silica particles having a particle size of larger than 30 μm | 5 ppm |
| (d3): carbon-coated fused silica particles having a particle size of larger than 20 μm | 10 ppm |

Figure 6A:
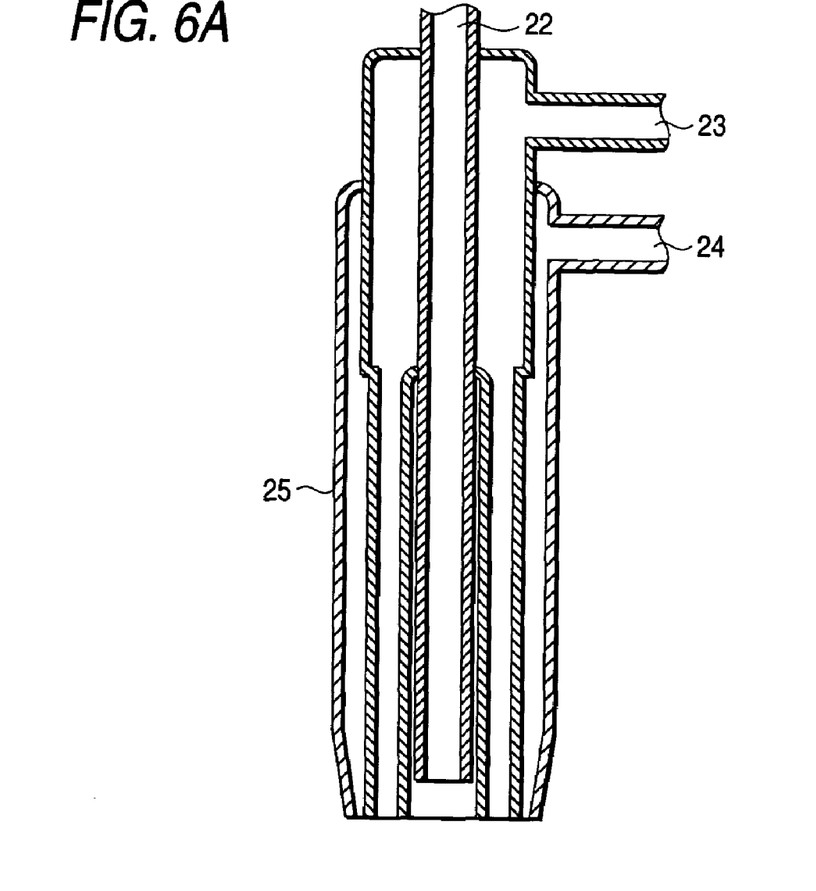
FIG. 6A is a vertical cross-sectional view showing the constitution of the burner of the production apparatus of FIG. 5.
Figure 6B:
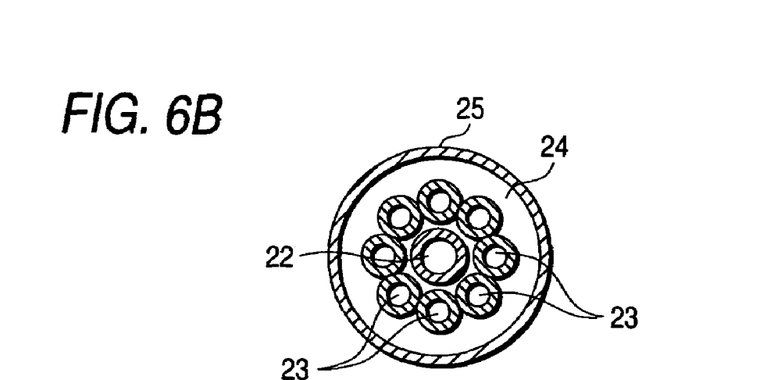
FIG. 6B is a horizontal cross-sectional view of FIG. 6A.

Spherical Fused Silica Particles (2-a):
Using the vertical furnace of FIG. 5 and FIG. 6 illustrated hereinabove, spherical fused silica particles (having a mean particle size of 20 μm) were produced in the manner mentioned below. Concretely, a siliceous material, ground powder (having a particle size of at most 66 μm) of silica stones (99.5% SiO$_2$, 0.063% Al$_2$O$_3$, 0.002% Fe$_2$O$_3$, 0.002% Na$_2$O and 0.003% K$_2$O) was prepared, and this was continuously fed into the vertical furnace through the feeder at a rate of 10 kg/hr, along with gas flames (having a flame length of 50 cm) at 2000° C. or higher of a mixed gas of hydrogen [30 Nm$^3$/hr, flow rate of 43.9 m/sec] and oxygen [15 Nm$^3$/hr, flow rate of 8.3 m/sec] thereinto. In that manner, spherical fused silica particles (2-a) (having a mean particle size of 20 μm) were produced.

Spherical Fused Silica Particles (2-b):

Using the vertical furnace of FIG. 5 and FIG. 6 illustrated hereinabove, spherical fused silica particles (having a mean particle size of 20 μm) were produced in the manner mentioned below. Concretely, a siliceous material, ground powder (having a particle size of at most 66 m) of silica stones (99.5% SiO$_2$, 0.063% Al$_2$O$_3$, 0.002% Fe$_2$O$_3$, 0.002% Na$_2$O and 0.003% K$_2$O) was prepared, and this was continuously fed into the vertical furnace through the feeder at a rate of 10 kg/hr, along with gas flames (having a flame length of 30 cm) at 2000° C. or higher of a mixed gas of propane [10 Nm$^3$/hr, flow rate of 12.0 m/sec] and oxygen [5 Nm$^3$/hr, flow rate of 6.2 m/sec] thereinto. In that manner, spherical fused silica particles (2-b) (having a mean particle size of 20 μm) were produced.

Spherical Fused Silica Particles (2-c):

Using the vertical furnace of FIG. 5 and FIG. 6 illustrated hereinabove, spherical fused silica particles (having a mean particle size of 10 μm) were produced in the manner mentioned below. Concretely, a siliceous material, ground powder (having a particle size of at most 44 μm) of silica stones (99.5% SiO$_2$, 0.063% Al$_2$O$_3$, 0.002% Fe$_2$O$_3$, 0.002% Na$_2$O and 0.003% K$_2$O) was prepared, and this was continuously fed into the vertical furnace through the feeder at a rate of 8 kg/hr, along with gas flames (having a flame length of 50 cm) at 2000° C. or higher of a mixed gas of hydrogen [30 Nm$^3$/hr, flow rate of 43.9 m/sec] and oxygen [15 Nm$^3$/hr, flow rate of 8.3 m/sec] thereinto. In that manner, spherical fused silica particles (2-c) (having a mean particle size of 10 μm) were produced.

Spherical Fused Silica Particles (2-d):

Using the vertical furnace of FIG. 5 and FIG. 6 illustrated hereinabove, spherical fused silica particles (having a mean particle size of 10 μm) were produced in the manner mentioned below. Concretely, a siliceous material, ground powder (having a particle size of at most 44 μm) of silica stones (99.5% SiO$_2$, 0.063% Al$_2$O$_3$, 0.002% Fe$_2$O$_3$, 0.002% Na$_2$O and 0.003% K$_2$O) was prepared, and this was continuously fed into the vertical furnace through the feeder at a rate of 8 kg/hr, along with gas flames (having a flame length of 30 cm) at 2000° C. or higher of a mixed gas of propane [10 Nm$^3$/hr, flow rate of 12.0 m/sec] and oxygen [5 Nm$^3$/hr, flow rate of 6.2 m/sec] thereinto. In that manner, spherical fused silica particles (2-d) (having a mean particle size of 10 μm) were produced.

Spherical Fused Silica Particles (3-a):

Using the vertical furnace of FIG. 5 and FIG. 6 illustrated hereinabove, spherical fused silica particles (having a mean particle size of 20 μm) were produced in the manner mentioned below. Concretely, a siliceous material, ground powder (having a particle size of at most 66 μm) of silica stones (99.5% SiO$_2$, 0.063% Al$_2$O$_3$, 0.002% Fe$_2$O$_3$, 0.002% Na$_2$O and 0.003% K$_2$O) was prepared, and this was continuously fed into the vertical furnace through the material feed duct (inner tube) 22 of the feeder at a rate of 10 kg/hr, along with a mixed gas of propane and oxygen (1/1 by volume) [30 Nm$^3$/hr, flow rate of 43.9 m/sec] thereinto through the small tubes 23 disposed in the space between the outer tube 25 and the material feed duct (inner tube) 22 and with oxygen gas [15 Nm$^3$/hr, flow rate of 8.3 m/sec] thereinto through the space between the outer tube 25 and the small tubes 23. The gases formed gas flames (having a flame length of 50 cm) at 2000° C. or higher in the furnace. In that manner, spherical fused silica particles (3-a) (having a mean particle size of 20 μm) were produced.

Spherical Fused Silica Particles (3-b):

Using the vertical furnace of FIG. 5 and FIG. 6 illustrated hereinabove, spherical fused silica particles (having a mean particle size of 20 μm) were produced in the manner mentioned below. Concretely, a siliceous material, ground powder (having a particle size of at most 66 μm) of silica stones (99.5% SiO$_2$, 0.063% Al$_2$O$_3$, 0.002% Fe$_2$O$_3$, 0.002% Na$_2$O and 0.003% K$_2$O) was prepared, and this was continuously fed into the vertical furnace through the material feed duct (inner tube) 22 of the feeder at a rate of 10 kg/hr, along with propane gas [10 Nm$^3$/hr, flow rate of 12.0 m/sec] thereinto through the small tubes 23 disposed in the space between the outer tube 25 and the material feed duct (inner tube) 22 and with oxygen gas [5 Nm$^3$/hr, flow rate of 6.2 m/sec] thereinto through the space between the outer tube 25 and the small tubes 23. The gases formed gas flames (having a flame length of 30 cm) at 2000° C. or higher in the furnace. In that manner, spherical fused silica particles (3-b) (having a mean particle size of 20 μm) were produced.

Spherical Fused Silica Particles (3-c):

Using the vertical furnace of FIG. 5 and FIG. 6 illustrated hereinabove, spherical fused silica particles (having a mean particle size of 10 μm) were produced in the manner mentioned below. Concretely, a siliceous material, ground powder (having a particle size of at most 44 μm) of silica stones (99.5% SiO$_2$, 0.063% Al$_2$O$_3$, 0.002% Fe$_2$O$_3$, 0.002% Na$_2$O and 0.003% K$_2$O) was prepared, and this was continuously fed into the vertical furnace through the material feed duct (inner tube) 22 of the feeder at a rate of 8 kg/hr, along with a mixed gas of propane and oxygen (1/1 by volume) [30 Nm$^3$/hr, flow rate of 43.9 m/sec] thereinto through the small tubes 23 disposed in the space between the outer tube 25 and the material feed duct (inner tube) 22 and with oxygen gas [15 Nm$^3$/hr, flow rate of 8.3 m/sec] thereinto through the space between the outer tube 25 and the small tubes 23. The gases formed gas flames (having a flame length of 50 cm) at 2000° C. or higher in the furnace. In that manner, spherical fused silica particles (3-c) (having a mean particle size of 10 μm) were produced.

Spherical Fused Silica Particles (3-d):

Using the vertical furnace of FIG. 5 and FIG. 6 illustrated hereinabove, spherical fused silica particles (having a mean particle size of 10 μm) were produced in the manner mentioned below. Concretely, a siliceous material, ground powder (having a particle size of at most 44 μm) of silica stones (99.5% SiO$_2$, 0.063% Al$_2$O$_3$, 0.002% Fe$_2$O$_3$, 0.002% Na$_2$O and 0.003% K$_2$O) was prepared, and this was continuously fed into the vertical furnace through the material feed duct (inner tube) 22 of the feeder at a rate of 8 kg/hr, along with propane gas [10 Nm$^3$/hr, flow rate of 12.0 m/sec] thereinto through the small tubes 23 disposed in the space between the outer tube 25 and the material feed duct (inner tube) 22 and with oxygen gas [5 Nm$^3$/hr, flow rate of 6.2 m/sec] thereinto through the space between the outer tube 25 and the small tubes 23. The gases formed gas flames (having a flame length of 30 cm) at 2000° C. or higher in the furnace. In that manner, spherical fused silica particles (3-d) (having a mean particle size of 10 μm) were produced.

(1) Encapsulation of Semiconductor Device A:

EXAMPLES A1 TO A8, COMPARATIVE EXAMPLES A1 TO A6, EXAMPLES A'1 TO A'8, COMPARATIVE EXAMPLES A'1 TO A'6, EXAMPLES A"1 TO A"8, COMPARATIVE EXAMPLES A"L TO A"6

The components shown in the following Tables 1 to 3, Tables 1' to 3' and Tables 1" to 31" were put into a Henschel mixer in the ratio also shown in these Tables, and then mixed therein for 30 minutes. In this process, the pigment carbon black was previously mixed with the epoxy resin (a) by the use of a 3-roll mixer (blend ratio of carbon black/epoxy resin (a)=1/10 by weight) to prepare a premix, and this was used. Thus prepared, the mixture was fed into a kneading extruder and melt-kneaded through it. Next, the resulting melt was cooled, ground and then tabletted by the use of a tabletting mold into tablets of epoxy resin composition.

TABLE 1

(parts by weight)

| | Example A | | | | | |
|---|---|---|---|---|---|---|
| | 1 | 2 | 3 | 4 | 5 | 6 |
| Epoxy resin (a) | 30 | 30 | 30 | 30 | 30 | 30 |
| Flame Retardant | 13 | 13 | 13 | 13 | 13 | 13 |
| Phenol-Novolak Resin | 55 | 55 | 55 | 55 | 55 | 55 |
| Curing Promoter | 1 | 1 | 1 | 1 | 1 | 1 |
| Premix of Carbon Black/ Epoxy Resin (a) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Inorganic Filler (1-a) | 250 | 200 | 100 | 100 | 0 | 50 |
| Inorganic Filler (1-b) | 400 | 400 | 1100 | 600 | 0 | 500 |
| Inorganic Filler (1-c) | 450 | 600 | 0 | 500 | 1200 | 0 |
| Content of All Carbon-Coated, Fused Silica Particles (ppm) | | | | | | |
| larger than 60 μm | 2.3 | 1.7 | 0.8 | 0.8 | 0.0 | 0.9 |
| larger than 30 μm | 6.4 | 5.0 | 6.3 | 4.2 | 0.0 | 6.4 |
| larger than 20 μm | 12.7 | 10.0 | 12.5 | 8.3 | 0.0 | 49.1 |

TABLE 2

(parts by weight)

| | Example A | |
|---|---|---|
| | 7 | 8 |
| Epoxy resin (a) | 30 | 30 |
| Flame Retardant | 13 | 13 |
| Phenol-Novolak Resin | 55 | 55 |
| Curing Promoter | 1 | 1 |
| Premix of Carbon Black/Epoxy Resin (a) (1/10) | 77 | 77 |
| Flame Retardation Promoter | 11 | 11 |
| Mold Release | 1 | 1 |
| Inorganic Filler (1-a) | 100 | 0 |
| Inorganic Filler (1-b) | 300 | 600 |
| Inorganic Filler (1-c) | 200 | 0 |
| Content of All Carbon-Coated, Fused Silica Particles (ppm) larger than 60 μm | 1.7 | 0.0 |
| larger than 30 μm | 5.8 | 5.0 |
| larger than 20 μm | 11.7 | 10.0 |

TABLE 3

(parts by weight)

| | Comparative Example A | | | | | |
|---|---|---|---|---|---|---|
| | 1 | 2 | 3 | 4 | 5 | 6 |
| Epoxy resin (a) | 30 | 30 | 30 | 30 | 30 | 30 |
| Flame Retardant | 13 | 13 | 13 | 13 | 13 | 13 |
| Phenol-Novolak Resin | 55 | 55 | 55 | 55 | 55 | 55 |
| Curing Promoter | 1 | 1 | 1 | 1 | 1 | 1 |
| Premix of Carbon Black/ Epoxy Resin (a) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Inorganic Filler (1-a) | 1200 | 600 | 400 | 600 | 400 | 300 |
| Inorganic Filler (1-b) | 0 | 0 | 500 | 0 | 100 | 200 |
| Inorganic Filler (1-c) | 0 | 600 | 300 | 0 | 100 | 100 |
| Content of All Carbon-Coated, Fused Silica Particles (ppm) | | | | | | |
| larger than 60 μm | 10.0 | 5.0 | 3.3 | 10.0 | 6.7 | 5.0 |
| larger than 30 μm | 20.0 | 10.0 | 8.8 | 20.0 | 14.2 | 11.7 |
| larger than 20 μm | 40.0 | 20.0 | 17.5 | 40.0 | 28.3 | 23.3 |

TABLE 1'

(parts by weight)

| | Example A' | | | | | |
|---|---|---|---|---|---|---|
| | 1 | 2 | 3 | 4 | 5 | 6 |
| Epoxy resin (a) | 30 | 30 | 30 | 30 | 30 | 30 |
| Flame Retardant | 13 | 13 | 13 | 13 | 13 | 13 |
| Phenol-Novolak Resin | 55 | 55 | 55 | 55 | 55 | 55 |
| Curing Promoter | 1 | 1 | 1 | 1 | 1 | 1 |
| Premix of Carbon Black/ Epoxy Resin (a) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Spherical Fused Silica Particles (2-a) | 1200 | 1000 | 800 | 600 | 600 | 500 |
| Spherical Fused Silica Particles (2-b) | 0 | 200 | 400 | 600 | 0 | 100 |

TABLE 2'

(parts by weight)

| | Example A' | |
|---|---|---|
| | 7 | 8 |
| Epoxy resin (a) | 30 | 30 |
| Flame Retardant | 13 | 13 |
| Phenol-Novolak Resin | 55 | 55 |

TABLE 2'-continued (parts by weight)

| | Example A' | |
|---|---|---|
| | 7 | 8 |
| Curing Promoter | 1 | 1 |
| Premix of Carbon Black/Epoxy Resin (a) (1/10) | 77 | 77 |
| Flame Retardation Promoter | 11 | 11 |
| Mold Release | 1 | 1 |
| Spherical Fused Silica Particles (2-a) | 400 | 300 |
| Spherical Fused Silica Particles (2-b) | 200 | 300 |

TABLE 3'

(parts by weight)

| | Comparative Example A' | | | | | |
|---|---|---|---|---|---|---|
| | 1 | 2 | 3 | 4 | 5 | 6 |
| Epoxy resin (a) | 30 | 30 | 30 | 30 | 30 | 30 |
| Flame Retardant | 13 | 13 | 13 | 13 | 13 | 13 |
| Phenol-Novolak Resin | 55 | 55 | 55 | 55 | 55 | 55 |
| Curing Promoter | 1 | 1 | 1 | 1 | 1 | 1 |
| Premix of Carbon Black/Epoxy Resin (a) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Spherical Fused Silica Particles (2-a) | 0 | 300 | 500 | 0 | 100 | 200 |
| Spherical Fused Silica Particles (2-b) | 1200 | 900 | 700 | 600 | 500 | 400 |

TABLE 1"

(parts by weight)

| | Example A" | | | | | |
|---|---|---|---|---|---|---|
| | 1 | 2 | 3 | 4 | 5 | 6 |
| Epoxy resin (a) | 30 | 30 | 30 | 30 | 30 | 30 |
| Flame Retardant | 13 | 13 | 13 | 13 | 13 | 13 |
| Phenol-Novolak Resin | 55 | 55 | 55 | 55 | 55 | 55 |
| Curing Promoter | 1 | 1 | 1 | 1 | 1 | 1 |
| Premix of Carbon Black/Epoxy Resin (a) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Spherical Fused Silica Particles (3-a) | 1200 | 1000 | 800 | 600 | 600 | 500 |
| Spherical Fused Silica Particles (3-b) | 0 | 200 | 400 | 600 | 0 | 100 |

TABLE 2"

(parts by weight)

| | Example A" | |
|---|---|---|
| | 7 | 8 |
| Epoxy resin (a) | 30 | 30 |
| Flame Retardant | 13 | 13 |
| Phenol-Novolak Resin | 55 | 55 |
| Curing Promoter | 1 | 1 |
| Premix of Carbon | 77 | 77 |

TABLE 2"-continued (parts by weight)

| | Example A" | |
|---|---|---|
| | 7 | 8 |
| Black/Epoxy Resin (a) (1/10) | | |
| Flame Retardation Promoter | 11 | 11 |
| Mold Release | 1 | 1 |
| Spherical Fused Silica Particles (3-a) | 400 | 300 |
| Spherical Fused Silica Particles (3-b) | 200 | 300 |

TABLE 3"

(parts by weight)

| | Comparative Example A" | | | | | |
|---|---|---|---|---|---|---|
| | 1 | 2 | 3 | 4 | 5 | 6 |
| Epoxy resin (a) | 30 | 30 | 30 | 30 | 30 | 30 |
| Flame Retardant | 13 | 13 | 13 | 13 | 13 | 13 |
| Phenol-Novolak Resin | 55 | 55 | 55 | 55 | 55 | 55 |
| Curing Promoter | 1 | 1 | 1 | 1 | 1 | 1 |
| Premix of Carbon Black/Epoxy Resin (a) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Spherical Fused Silica Particles (3-a) | 0 | 300 | 500 | 0 | 100 | 200 |
| Spherical Fused Silica Particles (3-b) | 1200 | 900 | 700 | 600 | 500 | 400 |

Using the thus-obtained tablets of each epoxy resin composition of Examples and Comparative Examples, a semiconductor chip (size: 10×10 mm) was transfer-molded (at 175° C. for 120 seconds) and post-cured at 175° C. for 5 hours to give a semiconductor device as in FIG. 3. This package is 208-pin QFP (quad flat package).

Package Form:
  208-pin QFP (quad flat package)-type, size 28 mm×28 mm×2.8 mm thickness.
  Semiconductor chip 3, size 10 mm×10 mm×370 μm thickness.
  Metal lead frame 7: copper (size, 11 mm×11 mm×100 μm thickness).
  Wire 6: gold, diameter 25 μm, pitch 85 μm, wire-to-wire distance 60 μm.

The semiconductor devices produced in the manner as above were analyzed and evaluated in point of the occurrence of short circuits therein. Concretely, the electric resistance value between the neighboring inner leads 8 not electrically connected to each other on the semiconductor chip was measured, and when it was 1 kΩ or smaller, then it means that the neighboring inner leads 8 short-circuited. 3000 samples were tested, and the number of the short-circuited ones thereof was counted. The results are given in the following Tables 4 to 6, Tables 4' to 6' and Tables 4" to 6".

TABLE 4

| | Example A | | | | | |
|---|---|---|---|---|---|---|
| | 1 | 2 | 3 | 4 | 5 | 6 |
| Number of Failed Samples with short circuits (/3000 samples tested) | 0 | 0 | 0 | 0 | 0 | 0 |

TABLE 5

| | Example A | |
|---|---|---|
| | 7 | 8 |
| Number of Failed Samples with short circuits (/3000 samples tested) | 0 | 0 |

TABLE 6

| | Comparative Example A | | | | | |
|---|---|---|---|---|---|---|
| | 1 | 2 | 3 | 4 | 5 | 6 |
| Number of Failed Samples with short circuits (/3000 samples tested) | 7 | 3 | 1 | 5 | 3 | 2 |

TABLE 4'

| | Example A' | | | | | |
|---|---|---|---|---|---|---|
| | 1 | 2 | 3 | 4 | 5 | 6 |
| Number of Failed Samples with short circuits (/3000 samples tested) | 0 | 0 | 0 | 0 | 0 | 0 |

TABLE 5'

| | Example A' | |
|---|---|---|
| | 7 | 8 |
| Number of Failed Samples with short circuits (/3000 samples tested) | 0 | 0 |

TABLE 6'

| | Comparative Example A' | | | | | |
|---|---|---|---|---|---|---|
| | 1 | 2 | 3 | 4 | 5 | 6 |
| Number of Failed Samples with short circuits (/3000 samples tested) | 10 | 6 | 3 | 7 | 5 | 2 |

TABLE 4"

| | Example A" | | | | | |
|---|---|---|---|---|---|---|
| | 1 | 2 | 3 | 4 | 5 | 6 |
| Number of Failed Samples with short circuits (/3000 samples tested) | 0 | 0 | 0 | 0 | 0 | 0 |

TABLE 5"

| | Example A" | |
|---|---|---|
| | 7 | 8 |
| Number of Failed Samples with short circuits (/3000 samples tested) | 0 | 0 |

TABLE 6"

| | Comparative Example A" | | | | | |
|---|---|---|---|---|---|---|
| | 1 | 2 | 3 | 4 | 5 | 6 |
| Number of Failed Samples with short circuits (/3000 samples tested) | 4 | 2 | 1 | 3 | 2 | 1 |

As in the above Tables 4 to 6, Tables 4' to 6' and Tables 4" to 6", no short circuit occurred in the samples of Examples of the invention. As opposed to these, however, short circuits occurred in the samples of Comparative Examples in which the content of carbon-coated fused silica particles was more than 2.5 ppm of the inorganic filler used. In addition, short circuits also occurred in the samples of Comparative Examples in which the content of the spherical fused silica particles that had been produced by the use of the combustion heat of propane gas and oxygen gas according to a conventional method was more than 50% by weight of the inorganic filler used.

(2) Encapsulation of Semiconductor Device B:

EXAMPLES B1 TO B8, COMPARATIVE
EXAMPLES B1 TO B6, EXAMPLES B1' TO B8',
COMPARATIVE EXAMPLES B1' TO B6',
EXAMPLES B1" TO B8", COMPARATIVE
EXAMPLES B1" TO B6"

The components shown in the following Tables 7 to 9, Tables 7' to 9' and Tables 7" to 9" were put into a Henschel mixer in the ratio also shown in these Tables, and then mixed therein for 30 minutes. In this process, the pigment carbon black was previously mixed with the epoxy resin (b) by the use of a 3-roll mixer (blend ratio of carbon black/epoxy resin (b)=1/10 by weight) to prepare a premix, and this was used. Thus prepared, the mixture was fed into a kneading extruder and melt-kneaded through it. Next, the resulting melt was cooled, ground and then tabletted by the use of a tabletting mold into tablets of epoxy resin composition.

TABLE 7

(parts by weight)

|  | Example B | | | | | |
|---|---|---|---|---|---|---|
|  | 1 | 2 | 3 | 4 | 5 | 6 |
| Epoxy resin (b) | 30 | 30 | 30 | 30 | 30 | 30 |
| Flame Retardant | 13 | 13 | 13 | 13 | 13 | 13 |
| Phenol-Novolak Resin | 55 | 55 | 55 | 55 | 55 | 55 |
| Curing Promoter | 1 | 1 | 1 | 1 | 1 | 1 |
| Premix of Carbon Black/Epoxy Resin (b) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Inorganic Filler (1-b) | 500 | 300 | 200 | 100 | 250 | 200 |
| Inorganic Filler (1-c) | 700 | 900 | 1000 | 1100 | 350 | 400 |
| Content of All Carbon-Coated, Fused Silica Particles (ppm) — larger than 60 μm | 0.0 | 0.0 | 0.0 | 0.0 | 0.0 | 0.0 |
| Content of All Carbon-Coated, Fused Silica Particles (ppm) — larger than 30 μm | 2.1 | 1.3 | 0.8 | 0.4 | 2.1 | 1.7 |
| Content of All Carbon-Coated, Fused Silica Particles (ppm) — larger than 20 μm | 4.2 | 2.5 | 1.7 | 0.8 | 4.2 | 16.7 |

TABLE 8

(parts by weight)

|  | Example B | |
|---|---|---|
|  | 7 | 8 |
| Epoxy resin (b) | 30 | 30 |
| Flame Retardant | 13 | 13 |
| Phenol-Novolak Resin | 55 | 55 |
| Curing Promoter | 1 | 1 |
| Premix of Carbon Black/Epoxy Resin (b) (1/10) | 77 | 77 |
| Flame Retardation Promoter | 11 | 11 |
| Mold Release | 1 | 1 |
| Inorganic Filler (1-b) | 150 | 100 |
| Inorganic Filler (1-c) | 450 | 500 |
| Content of All Carbon-Coated, Fused Silica Particles (ppm) — larger than 60 μm | 0.0 | 0.0 |
| Content of All Carbon-Coated, Fused Silica Particles (ppm) — larger than 30 μm | 1.3 | 0.8 |
| Content of All Carbon-Coated, Fused Silica Particles (ppm) — larger than 20 μm | 2.5 | 1.7 |

TABLE 9

(parts by weight)

|  | Comparative Example B | | | | | |
|---|---|---|---|---|---|---|
|  | 1 | 2 | 3 | 4 | 5 | 6 |
| Epoxy resin (b) | 30 | 30 | 30 | 30 | 30 | 30 |
| Flame Retardant | 13 | 13 | 13 | 13 | 13 | 13 |
| Phenol-Novolak Resin | 55 | 55 | 55 | 55 | 55 | 55 |
| Curing Promoter | 1 | 1 | 1 | 1 | 1 | 1 |
| Premix of Carbon Black/Epoxy Resin (b) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Inorganic Filler (1-b) | 700 | 800 | 1100 | 350 | 400 | 450 |
| Inorganic Filler (1-c) | 500 | 400 | 100 | 250 | 200 | 150 |
| Content of All Carbon-Coated, Fused Silica Particles (ppm) — larger than 60 μm | 0.0 | 0.0 | 0.0 | 0.0 | 0.0 | 0.0 |
| Content of All Carbon-Coated, Fused Silica Particles (ppm) — larger than 30 μm | 2.9 | 3.3 | 4.6 | 2.9 | 3.3 | 3.8 |
| Content of All Carbon-Coated, Fused Silica Particles (ppm) — larger than 20 μm | 5.8 | 6.7 | 9.2 | 5.8 | 6.7 | 7.5 |

TABLE 7'

(parts by weight)

|  | Example B' | | | | | |
|---|---|---|---|---|---|---|
|  | 1 | 2 | 3 | 4 | 5 | 6 |
| Epoxy resin (b) | 30 | 30 | 30 | 30 | 30 | 30 |
| Flame Retardant | 13 | 13 | 13 | 13 | 13 | 13 |
| Phenol-Novolak Resin | 55 | 55 | 55 | 55 | 55 | 55 |
| Curing Promoter | 1 | 1 | 1 | 1 | 1 | 1 |
| Premix of Carbon Black/Epoxy Resin (b) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Spherical Fused Silica Particles (2-a) | 1200 | 1000 | 800 | 600 | 600 | 500 |
| Spherical Fused Silica Particles (2-b) | 0 | 200 | 400 | 600 | 0 | 100 |

TABLE 8'

(parts by weight)

|  | Example B' | |
|---|---|---|
|  | 7 | 8 |
| Epoxy resin (b) | 30 | 30 |
| Flame Retardant | 13 | 13 |
| Phenol-Novolak Resin | 55 | 55 |
| Curing Promoter | 1 | 1 |
| Premix of Carbon Black/Epoxy Resin (b) (1/10) | 77 | 77 |
| Flame Retardation Promoter | 11 | 11 |
| Mold Release | 1 | 1 |
| Spherical Fused Silica Particles (2-a) | 400 | 300 |
| Spherical Fused Silica Particles (2-b) | 200 | 300 |

TABLE 9'

(parts by weight)

|  | Comparative Example B' | | | | | |
|---|---|---|---|---|---|---|
|  | 1 | 2 | 3 | 4 | 5 | 6 |
| Epoxy resin (b) | 30 | 30 | 30 | 30 | 30 | 30 |
| Flame Retardant | 13 | 13 | 13 | 13 | 13 | 13 |
| Phenol-Novolak Resin | 55 | 55 | 55 | 55 | 55 | 55 |
| Curing Promoter | 1 | 1 | 1 | 1 | 1 | 1 |
| Premix of Carbon Black/Epoxy Resin (b) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Spherical Fused Silica Particles (2-a) | 0 | 300 | 500 | 0 | 100 | 200 |
| Spherical Fused Silica Particles (2-b) | 1200 | 900 | 700 | 600 | 500 | 400 |

TABLE 7''

(parts by weight)

|  | Example B'' | | | | | |
|---|---|---|---|---|---|---|
|  | 1 | 2 | 3 | 4 | 5 | 6 |
| Epoxy resin (b) | 30 | 30 | 30 | 30 | 30 | 30 |
| Flame Retardant | 13 | 13 | 13 | 13 | 13 | 13 |

TABLE 7"-continued (parts by weight)

|  | Example B" | | | | | |
|---|---|---|---|---|---|---|
|  | 1 | 2 | 3 | 4 | 5 | 6 |
| Phenol-Novolak Resin | 55 | 55 | 55 | 55 | 55 | 55 |
| Curing Promoter | 1 | 1 | 1 | 1 | 1 | 1 |
| Premix of Carbon Black/Epoxy Resin (b) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Spherical Fused Silica Particles (3-a) | 1200 | 1000 | 800 | 600 | 600 | 500 |
| Spherical Fused Silica Particles (3-b) | 0 | 200 | 400 | 600 | 0 | 100 |

TABLE 8"

(parts by weight)

|  | Example B" | |
|---|---|---|
|  | 7 | 8 |
| Epoxy resin (b) | 30 | 30 |
| Flame Retardant | 13 | 13 |
| Phenol-Novolak Resin | 55 | 55 |
| Curing Promoter | 1 | 1 |
| Premix of Carbon Black/Epoxy Resin (b) (1/10) | 77 | 77 |
| Flame Retardation Promoter | 11 | 11 |
| Mold Release | 1 | 1 |
| Spherical Fused Silica Particles (3-a) | 400 | 300 |
| Spherical Fused Silica Particles (3-b) | 200 | 300 |

TABLE 9"

(parts by weight)

|  | Comparative Example B" | | | | | |
|---|---|---|---|---|---|---|
|  | 1 | 2 | 3 | 4 | 5 | 6 |
| Epoxy resin (b) | 30 | 30 | 30 | 30 | 30 | 30 |
| Flame Retardant | 13 | 13 | 13 | 13 | 13 | 13 |
| Phenol-Novolak Resin | 55 | 55 | 55 | 55 | 55 | 55 |
| Curing Promoter | 1 | 1 | 1 | 1 | 1 | 1 |
| Premix of Carbon Black/Epoxy Resin (b) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Spherical Fused Silica Particles (3-a) | 0 | 300 | 500 | 0 | 100 | 200 |
| Spherical Fused Silica Particles (3-b) | 1200 | 900 | 700 | 600 | 500 | 400 |

Using the thus-obtained tablets of each epoxy resin composition, a semiconductor chip mounted on an insulating substrate was transfer-molded (at 175° C. for 1 minute and then post-cured at 175° C. for 5 hours) into a single-encapsulated semiconductor device as in FIG. 2.

Package Form:
Ball grid array (BGA)-type, size 35 mm×35 mm×1.5 mm thickness.
Resin encapsulation layer 4b (of cured epoxy resin composition), size 35 mm×35 mm×1.2 mm thickness.
Semiconductor chip 3, size 10 mm×10 mm×370 μm thickness.
Insulating substrate 5, bismaleimidotriazine (BT) resin/glass cloth substrate (size, 40 mm×40 mm×0.3 mm).
Wire 6: gold, diameter 20 μm, pitch 50 μm, wire-to-wire distance 30 μm.

Thus produced, the semiconductor devices were analyzed and evaluated in point of the occurrence of short circuits therein in the same manner as above. The results are given in the following Tables 10 to 12, Tables 10' to 12' and Tables 10" to 12".

TABLE 10

|  | Example B | | | | | |
|---|---|---|---|---|---|---|
|  | 1 | 2 | 3 | 4 | 5 | 6 |
| Number of Failed Samples with short circuits (/3000 samples tested) | 0 | 0 | 0 | 0 | 0 | 0 |

TABLE 11

|  | Example B | |
|---|---|---|
|  | 7 | 8 |
| Number of Failed Samples with short circuits (/3000 samples tested) | 0 | 0 |

TABLE 12

|  | Comparative Example B | | | | | |
|---|---|---|---|---|---|---|
|  | 1 | 2 | 3 | 4 | 5 | 6 |
| Number of Failed Samples with short circuits (/3000 samples tested) | 5 | 8 | 10 | 4 | 6 | 9 |

TABLE 10'

|  | Example B' | | | | | |
|---|---|---|---|---|---|---|
|  | 1 | 2 | 3 | 4 | 5 | 6 |
| Number of Failed Samples with short circuits (/3000 samples tested) | 0 | 0 | 0 | 0 | 0 | 0 |

TABLE 11'

|  | Example B' | |
|---|---|---|
|  | 7 | 8 |
| Number of Failed Samples with short circuits (/3000 samples tested) | 0 | 0 |

TABLE 12'

| | Comparative Example B' | | | | | |
|---|---|---|---|---|---|---|
| | 1 | 2 | 3 | 4 | 5 | 6 |
| Number of Failed Samples with short circuits (/3000 samples tested) | 35 | 22 | 13 | 26 | 19 | 11 |

TABLE 10"

| | Example B" | | | | | |
|---|---|---|---|---|---|---|
| | 1 | 2 | 3 | 4 | 5 | 6 |
| Number of Failed Samples with short circuits (/3000 samples tested) | 0 | 0 | 0 | 0 | 0 | 0 |

TABLE 11"

| | Example B" | |
|---|---|---|
| | 7 | 8 |
| Number of Failed Samples with short circuits (/3000 samples tested) | 0 | 0 |

TABLE 12"

| | Comparative Example B" | | | | | |
|---|---|---|---|---|---|---|
| | 1 | 2 | 3 | 4 | 5 | 6 |
| Number of Failed Samples with short circuits (/3000 samples tested) | 12 | 9 | 2 | 11 | 6 | 1 |

As in the above Tables 10 to 12, Tables 10' to 12' and Tables 10" to 12", no short circuit occurred in the samples of Examples of the invention. As opposed to these, however, short circuits occurred in the samples of Comparative Examples in which the content of carbon-coated fused silica particles was more than 2.5 ppm of the inorganic filler used. In addition, short circuits also occurred in the samples of Comparative Examples where the semiconductor chip was resin-encapsulated in the encapsulation material that contains spherical fused silica particles produced by the use of the combustion heat of a conventional mixed gas of propane and oxygen. Further, shorts circuits also occurred in the samples of Comparative Examples where the inorganic filler in the encapsulation material used contained more than 50% by weight of spherical fused silica particles that had been produced by the use of the combustion heat of propane gas and oxygen gas according to a conventional method.

(3) Encapsulation of Semiconductor Device C:

EXAMPLES C1 TO C8, COMPARATIVE EXAMPLES C1 TO C6, EXAMPLES C1' TO C8', COMPARATIVE EXAMPLES C1' TO C6', EXAMPLES C1" TO C8", COMPARATIVE EXAMPLES C1" TO C6"

The components shown in the following Tables 13 to 15, Tables 13' to 15' and Tables 13" to 15" were put into a Henschel mixer in the ratio also shown in these Tables, and then mixed therein for 30 minutes. In this process, the pigment carbon black was previously mixed with the epoxy resin (b) by the use of a 3-roll mixer (blend ratio of carbon black/epoxy resin (b)=1/10 by weight) to prepare a premix, and this was used. Thus prepared, the mixture was fed into a kneading extruder and melt-kneaded through it. Next, the resulting melt was cooled, ground and then tabletted by the use of a tabletting mold into tablets of epoxy resin composition.

TABLE 13

(parts by weight)

| | Example C | | | | | |
|---|---|---|---|---|---|---|
| | 1 | 2 | 3 | 4 | 5 | 6 |
| Epoxy resin (b) | 30 | 30 | 30 | 30 | 30 | 30 |
| Flame Retardant | 13 | 13 | 13 | 13 | 13 | 13 |
| Phenol-Novolak Resin | 55 | 55 | 55 | 55 | 55 | 55 |
| Curing Promoter | 1 | 1 | 1 | 1 | 1 | 1 |
| Premix of Carbon Black/Epoxy Resin (b) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Inorganic Filler (1-d) | 500 | 300 | 200 | 100 | 250 | 200 |
| Inorganic Filler (1-c) | 700 | 900 | 1000 | 1100 | 350 | 400 |
| Content of All Carbon-Coated, Fused Silica Particles (ppm) | | | | | | |
| larger than 60 nm | 0.0 | 0.0 | 0.0 | 0.0 | 0.0 | 0.0 |
| larger than 30 nm | 2.1 | 1.3 | 0.8 | 0.4 | 2.1 | 1.7 |
| larger than 20 nm | 4.2 | 2.5 | 1.7 | 0.8 | 4.2 | 16.7 |

TABLE 14

(parts by weight)

| | | Example C | |
|---|---|---|---|
| | | 7 | 8 |
| Epoxy resin (b) | | 30 | 30 |
| Flame Retardant | | 13 | 13 |
| Phenol-Novolak Resin | | 55 | 55 |
| Curing Promoter | | 1 | 1 |
| Premix of Carbon Black/Epoxy Resin (b) (1/10) | | 77 | 77 |
| Flame Retardation Promoter | | 11 | 11 |
| Mold Release | | 1 | 1 |
| Inorganic Filler (1-d) | | 150 | 100 |
| Inorganic Filler (1-c) | | 450 | 500 |
| Content of All Carbon-Coated, Fused Silica Particles (ppm) | larger than 60 nm | 0.0 | 0.0 |
| | larger than 30 nm | 1.3 | 0.8 |
| | larger than 20 nm | 2.5 | 1.7 |

TABLE 15

(parts by weight)

| | Comparative Example C | | | | | |
|---|---|---|---|---|---|---|
| | 1 | 2 | 3 | 4 | 5 | 6 |
| Epoxy resin (b) | 30 | 30 | 30 | 30 | 30 | 30 |
| Flame Retardant | 13 | 13 | 13 | 13 | 13 | 13 |
| Phenol-Novolak Resin | 55 | 55 | 55 | 55 | 55 | 55 |
| Curing Promoter | 1 | 1 | 1 | 1 | 1 | 1 |
| Premix of Carbon Black/Epoxy Resin (b) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Inorganic Filler (1-d) | 700 | 800 | 1100 | 350 | 400 | 450 |
| Inorganic Filler (1-c) | 500 | 400 | 100 | 250 | 200 | 150 |
| Content of All Carbon-Coated, Fused Silica Particles (ppm) | | | | | | |
| larger than 60 nm | 0.0 | 0.0 | 0.0 | 0.0 | 0.0 | 0.0 |
| larger than 30 nm | 2.9 | 3.3 | 4.6 | 2.9 | 3.3 | 3.8 |
| larger than 20 nm | 5.8 | 6.7 | 9.2 | 5.8 | 6.7 | 7.5 |

TABLE 13'

(parts by weight)

| | Example C' | | | | | |
|---|---|---|---|---|---|---|
| | 1 | 2 | 3 | 4 | 5 | 6 |
| Epoxy resin (b) | 30 | 30 | 30 | 30 | 30 | 30 |
| Flame Retardant | 13 | 13 | 13 | 13 | 13 | 13 |
| Phenol-Novolak Resin | 55 | 55 | 55 | 55 | 55 | 55 |
| Curing Promoter | 1 | 1 | 1 | 1 | 1 | 1 |
| Premix of Carbon Black/Epoxy Resin (b) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Spherical Fused Silica Particles (2-c) | 1200 | 1000 | 800 | 600 | 600 | 500 |
| Spherical Fused Silica Particles (2-d) | 0 | 200 | 400 | 600 | 0 | 100 |

TABLE 14'

(parts by weight)

| | Example C' | |
|---|---|---|
| | 7 | 8 |
| Epoxy resin (b) | 30 | 30 |
| Flame Retardant | 13 | 13 |
| Phenol-Novolak Resin | 55 | 55 |
| Curing Promoter | 1 | 1 |
| Premix of Carbon Black/Epoxy Resin (b) (1/10) | 77 | 77 |
| Flame Retardation Promoter | 11 | 11 |
| Mold Release | 1 | 1 |
| Spherical Fused Silica Particles (2-c) | 400 | 300 |
| Spherical Fused Silica Particles (2-d) | 200 | 300 |

TABLE 15'

(parts by weight)

| | Comparative Example C' | | | | | |
|---|---|---|---|---|---|---|
| | 1 | 2 | 3 | 4 | 5 | 6 |
| Epoxy resin (b) | 30 | 30 | 30 | 30 | 30 | 30 |
| Flame Retardant | 13 | 13 | 13 | 13 | 13 | 13 |
| Phenol-Novolak Resin | 55 | 55 | 55 | 55 | 55 | 55 |
| Curing Promoter | 1 | 1 | 1 | 1 | 1 | 1 |
| Premix of Carbon Black/Epoxy Resin (b) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Spherical Fused Silica Particles (2-c) | 0 | 300 | 500 | 0 | 100 | 200 |
| Spherical Fused Silica Particles (2-d) | 1200 | 900 | 700 | 600 | 500 | 400 |

TABLE 13"

(parts by weight)

| | Example C" | | | | | |
|---|---|---|---|---|---|---|
| | 1 | 2 | 3 | 4 | 5 | 6 |
| Epoxy resin (b) | 30 | 30 | 30 | 30 | 30 | 30 |
| Flame Retardant | 13 | 13 | 13 | 13 | 13 | 13 |
| Phenol-Novolak Resin | 55 | 55 | 55 | 55 | 55 | 55 |
| Curing Promoter | 1 | 1 | 1 | 1 | 1 | 1 |
| Premix of Carbon Black/Epoxy Resin (b) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Spherical Fused Silica Particles (3-c) | 1200 | 1000 | 800 | 600 | 600 | 500 |
| Spherical Fused Silica Particles (3-d) | 0 | 200 | 400 | 600 | 0 | 100 |

TABLE 14"

(parts by weight)

| | Example C" | |
|---|---|---|
| | 7 | 8 |
| Epoxy resin (b) | 30 | 30 |
| Flame Retardant | 13 | 13 |
| Phenol-Novolak Resin | 55 | 55 |
| Curing Promoter | 1 | 1 |
| Premix of Carbon Black/Epoxy Resin (b) (1/10) | 77 | 77 |
| Flame Retardation Promoter | 11 | 11 |
| Mold Release | 1 | 1 |
| Spherical Fused Silica Particles (3-c) | 400 | 300 |
| Spherical Fused Silica Particles (3-d) | 200 | 300 |

TABLE 15"

(parts by weight)

| | Comparative Example C" | | | | | |
|---|---|---|---|---|---|---|
| | 1 | 2 | 3 | 4 | 5 | 6 |
| Epoxy resin (b) | 30 | 30 | 30 | 30 | 30 | 30 |
| Flame Retardant | 13 | 13 | 13 | 13 | 13 | 13 |

TABLE 15"-continued (parts by weight)

| | Comparative Example C" | | | | | |
|---|---|---|---|---|---|---|
| | 1 | 2 | 3 | 4 | 5 | 6 |
| Phenol-Novolak Resin | 55 | 55 | 55 | 55 | 55 | 55 |
| Curing Promoter | 1 | 1 | 1 | 1 | 1 | 1 |
| Premix of Carbon Black/ Epoxy Resin (b) (1/10) | 77 | 77 | 77 | 77 | 77 | 77 |
| Flame Retardation Promoter | 11 | 11 | 11 | 11 | 11 | 11 |
| Mold Release | 1 | 1 | 1 | 1 | 1 | 1 |
| Spherical Fused Silica Particles (3-c) | 0 | 300 | 500 | 0 | 100 | 200 |
| Spherical Fused Silica Particles (3-d) | 1200 | 900 | 700 | 600 | 500 | 400 |

Using the thus-obtained tablets of each epoxy resin composition, a semiconductor chip mounted on an insulating substrate was transfer-molded (at 175° C. for 1 minute and then post-cured at 175° C. for 5 hours) into a single-encapsulated semiconductor device (FC-BGA) as in FIG. 1.

Package Form:
- Flip chip ball grid array (FC-BGA)-type, size 12 mm×12 mm×1 mm thickness.
- Resin encapsulation layer 4a (of cured epoxy resin composition), size 12 mm×12 mm×600 μm thickness.
- Semiconductor chip 3, size 10 mm×10 mm×370 μm thickness.
- Insulating substrate 1, bismaleimidotriazine (BT) resin/glass cloth substrate (size, 14 mm×14 mm×300 μm thickness).
- Interconnection electrode 2, gold bump, diameter 20 μm, pitch 50 μm, bump-to-bump distance 30 μm.

Thus produced, the semiconductor devices were analyzed and evaluated in point of the occurrence of short circuits therein in the same manner as above. Concretely, the electric resistance value between the neighboring gold bumps not electrically connected to each other was measured, and when it was 1 kΩ or smaller, then it means that the neighboring gold bumps short-circuited. The results are given in the following Tables 16 to 18, Tables 16' to 18' and Tables 16" to 18".

TABLE 16

| | Example C | | | | | |
|---|---|---|---|---|---|---|
| | 1 | 2 | 3 | 4 | 5 | 6 |
| Number of Failed Samples with short circuits (/3000 samples tested) | 0 | 0 | 0 | 0 | 0 | 0 |

TABLE 17

| | Example C | |
|---|---|---|
| | 7 | 8 |
| Number of Failed Samples with short circuits (/3000 samples tested) | 0 | 0 |

TABLE 18

| | Comparative Example C | | | | | |
|---|---|---|---|---|---|---|
| | 1 | 2 | 3 | 4 | 5 | 6 |
| Number of Failed Samples with short circuits (/3000 samples tested) | 3 | 9 | 12 | 3 | 7 | 11 |

TABLE 16'

| | Example C' | | | | | |
|---|---|---|---|---|---|---|
| | 1 | 2 | 3 | 4 | 5 | 6 |
| Number of Failed Samples with short circuits (/3000 samples tested) | 0 | 0 | 0 | 0 | 0 | 0 |

TABLE 17'

| | Example C' | |
|---|---|---|
| | 7 | 8 |
| Number of Failed Samples with short circuits (/3000 samples tested) | 0 | 0 |

TABLE 18'

| | Comparative Example C' | | | | | |
|---|---|---|---|---|---|---|
| | 1 | 2 | 3 | 4 | 5 | 6 |
| Number of Failed Samples with short circuits (/3000 samples tested) | 29 | 19 | 10 | 23 | 17 | 8 |

TABLE 16"

| | Example C" | | | | | |
|---|---|---|---|---|---|---|
| | 1 | 2 | 3 | 4 | 5 | 6 |
| Number of Failed Samples with short circuits (/3000 samples tested) | 0 | 0 | 0 | 0 | 0 | 0 |

TABLE 17"

| | Example C" | |
|---|---|---|
| | 7 | 8 |
| Number of Failed Samples with short circuits (/3000 samples tested) | 0 | 0 |

TABLE 18"

| | Comparative Example C" | | | | | |
|---|---|---|---|---|---|---|
| | 1 | 2 | 3 | 4 | 5 | 6 |
| Number of Failed Samples with short circuits (/3000 samples tested) | 13 | 5 | 2 | 11 | 3 | 1 |

As in the above Tables 16 to 18, Tables 16' to 18' and Tables 16" to 18", no short circuit occurred in the samples of Examples of the invention. As opposed to these, however, short circuits occurred in the samples of Comparative Examples in which the content of carbon-coated fused silica particles was more than 2.5 ppm of the inorganic filler used. In addition, short circuits also occurred in the samples of Comparative Examples where the semiconductor chip was resin-encapsulated in the encapsulation material that contains spherical fused silica particles produced by the use of the combustion heat of a conventional mixed gas of propane and oxygen. Further, shorts circuits also occurred in the samples of Comparative Examples where the inorganic filler in the encapsulation material used contained more than 50% by weight of spherical fused silica particles that had been produced by the use of the combustion heat of propane gas and oxygen gas according to a conventional method.

In the semiconductor device of the invention as described in detail hereinabove with reference to its preferred embodiments, the resin layer for semiconductor encapsulation is formed of a cured product of an epoxy resin composition that contains an inorganic filler (C) with at most 2.5 ppm of carbon-coated inorganic filler particles (c) having a particle size larger than the interconnection electrode or conductor wire distance in the semiconductor device. Accordingly, the semiconductor device is highly reliable and is free from the problem of short circuits to be caused of electric interconnection between the interconnection electrodes or between the conductor wires in the device.

Another type of the epoxy resin composition for semiconductor encapsulation of the invention contains an inorganic filler (C) with at least 50% by weight of spherical fused silica particles (c') for which the heat source in fusion is the combustion heat of a heat source material not causing carbon deposition on the surfaces of the spherical fused silica particles and oxygen gas. When the epoxy resin composition of the type is used for semiconductor encapsulation, it also realizes semiconductor devices of high reliability that are free from the problem of short circuits to occur therein.

While the invention has been described in detail and with reference to specific embodiments thereof, it will be apparent to one skilled in the art that various changes and modifications can be made therein without departing from the scope thereof.

This application is based on Japanese patent applications No. 2002-328726 filed Nov. 12, 2002, No. 2002-339797 filed Nov. 22, 2002, and No. 2002-339798 filed Nov. 22, 2002, the entire contents thereof being hereby incorporated by reference.

What is claimed is:

1. An epoxy resin composition for semiconductor encapsulation, which comprises the following components (A) to (C):
   (A) an epoxy resin,
   (B) a phenolic resin,
   (C) an inorganic filler capable of preventing semiconductors from short-circuiting in a step of semiconductor encapsulation with the epoxy resin composition,
   wherein the inorganic filler (C) contains from 0.02 ppm to 2.5 ppm of carbon-coated inorganic filler particles (c) having a particle size larger than an interconnection electrode distance or conductor wire distance in a semiconductor device.

2. The epoxy resin composition for semiconductor encapsulation as claimed in claim 1, wherein the inorganic filler (C) contains at least 50% by weight of spherical fused silica particles (c') for which the heat source in fusion is the combustion heat of a heat source material not causing carbon deposition on the surfaces of the spherical fused silica particles and oxygen gas.

3. The epoxy resin composition for semiconductor encapsulation as claimed in claim 2, wherein the spherical fused silica particles (c') are produced from a siliceous material which is fed into a furnace through a double-walled burner that comprises concentric inner and outer tubes and multiple small tubes provided between the inner and outer tubes, in such a manner that the siliceous material is via the inner tube, the heat source material for fusion not causing carbon deposition on the surfaces of the spherical fused silica particles is via the small tubes, and oxygen gas is via the space between the small tubes and the outer tube, and which is fused by the gas combustion in the furnace.

4. The epoxy resin composition for semiconductor encapsulation as claimed in claim 2, wherein the heat source material for fusion not causing carbon deposition on the surfaces of the spherical fused silica particles is hydrogen gas.

5. The epoxy resin composition for semiconductor encapsulation as claimed in claim 2, wherein the heat source material for fusion not causing carbon deposition on the surfaces of the spherical fused silica particles is a mixture of oxygen gas and combustible hydrocarbon gas.

6. A semiconductor device with a semiconductor chip encapsulated in the epoxy resin composition of claim 1.

7. The semiconductor device as claimed in claim 6, wherein the semiconductor chip is mounted on an insulating substrate or a lead frame and the semiconductor chip is electrically interconnected to the insulating substrate or the lead frame via an interconnection electrode or a conductor wire and the semiconductor chip mounted on the insulating substrate or lead frame is encapsulated in a layer of the epoxy resin composition.

* * * * *